United States Patent [19]

Rutten et al.

[11] Patent Number: 5,130,567
[45] Date of Patent: Jul. 14, 1992

[54] BIPOLAR TRANSISTOR ARRANGEMENT WITH DISTORTION COMPENSATION

[75] Inventors: Ivo W. J. M. Rutten; Robert E. J. Van De Grift, both of Eindhoven, Netherlands

[73] Assignee: U.S. Philips Corporation, New York, N.Y.

[21] Appl. No.: 513,308

[22] Filed: Apr. 20, 1990

[30] Foreign Application Priority Data

May 12, 1989 [NL] Netherlands ............... 8901203

[51] Int. Cl.$^5$ .............. H03K 3/01; H03K 19/086; H03K 17/60; G06G 7/12
[52] U.S. Cl. ................... 307/270; 307/455; 307/491; 307/494; 307/254
[58] Field of Search ........... 307/270, 254, 491, 494, 307/446, 455, 454, 355, 357

[56] References Cited

U.S. PATENT DOCUMENTS

| | | | |
|---|---|---|---|
| 3,492,588 | 1/1970 | Woodward, Jr. ............ | 307/219 |
| 3,509,380 | 4/1970 | Gillett et al. ............. | 307/455 |
| 4,550,262 | 10/1985 | Kohsiek ................. | 307/260 |
| 4,675,553 | 6/1987 | Price et al. ............. | 307/455 |
| 4,757,216 | 7/1988 | Tanahashi ............... | 307/455 |
| 4,961,046 | 10/1990 | De Jager ............... | 307/261 |

FOREIGN PATENT DOCUMENTS

0133724 3/1985 European Pat. Off. .

*Primary Examiner*—Stanley D. Miller
*Assistant Examiner*—Trong Phan
*Attorney, Agent, or Firm*—Bernard Franzblau

[57] ABSTRACT

A bipolar transistor arrangement with compensation for the distortion component (Id) in the collector current (Io+Id) of a transistor (T1), which component is caused by the logarithmic base-emitter voltage thereof. In order to provide this compensation a sub-current (Is) proportional to the emitter current (I+Ie) is generated. This sub-current is fed through an element (7) comprising at least one semiconductor junction. By means of a voltage-to-current converter (8) the logarithmic voltage appearing across this element is converted into a correction current (Ir) proportional to the distortion component (Id) and is applied to the collector of the transistor (T1) in order to compensate for the distortion component (Id) flowing in a load circuit (Rc) connected to the collector. The arrangement is suitable for use in voltage-to-current converters made up of bipolar transistors.

18 Claims, 5 Drawing Sheets

BIPOLAR TRANSISTOR ARRANGEMENT WITH DISTORTION COMPENSATION

BACKGROUND OF THE INVENTION

This invention relates to a bipolar transistor arrangement with distortion compensation. The arrangement comprises a bipolar transistor with d.c. bias means. The collector of said transistor constitutes a collector terminal for the connection of a load circuit and the base of said transistor constituter on input terminal for the connection of a signal/voltage source.

In addition to the d.c. bias current and the signal current, the collector current in such a transistor arrangement contains an undesirable distortion component which is dictated mainly by the logarithmic voltage across the base-emitter junction of the relevant transistor. As the emitter current increases, this distortion component also increases and limits the maximum voltage amplitude of the output signal to a value which is less than the theoretical maximum output swing attainable with a given supply voltages. This may be a disadvantage in particular in transistor arrangements operating with a comparatively low supply voltage.

SUMMARY OF THE INVENTION

It is an object of the invention to minimize the influence of this distortion component on the output signal of the transistor arrangement. This is achieved in that in operation the transistor arrangement comprises means for supplying a sub-current which is substantially linearly proportional to the current in the emitter of the transistor, at least one element having a semiconductor junction for supplying a voltage which depends on said sub-current, and conversion means for supplying a current which is proportional to said voltage (i.e. proportional to the distortion component); to the collector terminal of the transistor in order to compensate for that part of the collector current which depends upon the base-emitter voltage, i.e. to the distortion component.

The invention is based on the idea of adding to the collector current of the transistor a correction current derived from the emitter current. For this purpose a smaller sub-current, which is proportional to the current in the emitter of the relevant transistor, is generated. By means of this smaller sub-current a replica of the base-emitter voltage of the transistor is produced by passing this sub-current through one or more elements comprising a semiconductor junction. This results in a logarithmic voltage drop across these elements, which voltage drop is a replica of the logarithmic base-emitter voltage of the transistor which results in the distortion component in the collector current. If, subsequently, this logarithmic voltage drop is suitably converted into a correction current of the same magnitude as the distortion component in the collector current of the transistor, an effective compensation for said distortion component in the current through the load circuit is obtained, making it possible to obtain substantially the maximum output voltage swing in a given circuit arrangement.

Since the replica of the base-emitter voltage is generated by means of a correction circuit via a sub-current which can be substantially smaller than the emitter current in the relevant transistor, the inevitable distortion components in the correction circuit remain below a level which is negligible relative to the correction current to be generated.

For generating a su-current which is proportional to the emitter current of the transistor it is possible, inter alia, to employ a current-mirror circuit in the emitter line of the relevant transistor. However, the addition of circuit elements in the collector-emitter path of the transistor has the drawback that this leads to an undesirable reduction of the output swing of the relevant transistor.

In order to preclude this, a further embodiment of the arrangement in accordance wtih the invention is characterized in that the means for supplying the sub-current comprise a further bipolar transistor of the same conductivity type as and having a smaller emitter area than said one transistor, the base-emitter junctions of said one and said further transistor being arranged in parallel, thereby constituting a common base and emitter terminal, the collector of said further transistor constituting a further collector terminal, to which the at least one element havign a semiconductor junction and the conversion means are connected.

Through compensation of the distortion component in the output current of the transistor, this output current can be made to depend accurately and in a desired manner on an input signal. A further embodiment of the invention based on this is characterized in that said one transistor constitutes a first branch of a voltage to current converter, of which a second branch is constituted by a bipolar transistor of the same conductivity type, to which are connected a similar circuit comprising a further bipolar transistor having a smaller emitter area, at least one element having a semiconductor junction and d.c. bias means. The d.c. bias means comprise a current-reference circuit which in each branch is arranged in series with the common emitter terminals of said one and said further transistor, which emitter terminals are interconnected by a first impedance. The conversion means comprise a further voltage-to-current converter comprising first and second voltage input terminals, which are connected to the further collector terminals of the further transistors, respectively, and comprising at least one current output terminal to compensate, in at least one of the branches of the voltage to current converter, for that part of the collector current which depends upon the base-emitter voltage of the one transistor.

A voltage-current converter of this construction is very accurate and therefore suitable as a component for use in analog multiplier circuits, analog-to-digital converters etc.

Yet another embodiment of the transistor arrangement in accordance with the invention, which is constructed as a voltage-to-current converter, is characterized in that the further voltage-to-current converter comprises a first and a second bipolar transistor of the same conductivity type as said one and further transistor, the bases of said first and second transistors being connected to the further collector terminals of the further transistors associated respectively with the first and the second branch of the one voltage-to-current converter. A current-reference circuit is arranged in series with each of the emitters of the first and the second transistor, which emitters are interconnected via an impedance, and at least one of the first and the second transistors has its collector connected respectively to the collector terminal of the one transistor in the second and the first branch of the one voltage-to-current converter.

The use of a voltage-to-current converter in the circuit for generation of the correction current, which circuit is of a construction similar to that of the transistor arrangement itself, results in an arrangement which can be dimensioned simply. It is possible to demonstrate that when the at least one element having a semiconductor junction comprises a series arrangement of m diodes or m diode-connected transistors, m being an integer larger than 1, and if the emitter areas of said one transistors and those of said further transistors are equal as far as possible, and the respective impedances of the one voltage-to-current converter and the further voltage to current converter comprise a first and a second resistor respectively, an optimum distortion compensation is achieved when the resistance values of said first and said second resistors are in a ratio of 1: m.

When a voltage-to-current converter having an asymmetrical output is required, it is adequate to connect, for example, the collector of the first transistor to the collector terminal of the one transistor in the second branch of the voltage to current converter. However, if a symmetrical output is required, the collector of the second transistor should be connected to the collector terminal of the one transistor in the first branch of the voltage-to-current converter. The relevant collector terminals then constitute the output terminals for the connection of the load circuit.

Yet a further transistor arrangement in accordance with the invention, which is constructed as a voltage-to-current converter, is characterized in that said one transistor in a branch of the one voltage-to-current converter comprises two bipolar sub-transistors of the same conductivity type, the sum of the emitter areas of the two sub-transistors being equal to the emitter area of the originally one transistor, which sub-transistors have their base-emitter junctions arranged in parallel with one another. The further voltage-to-current converter comprises a first and a second bipolar transistor of the same conductivity type as said one and said further transistors, said first and said second transistor having their bases connected to the further collector terminals of the further transistors associated respectively with the first and the second branch of the one voltage-to-current converter. The emitter are connected to the collectors of the two sub-transistors, which emitters are interconnected via an impedance, and the collector of the first and the second transistor, in whose collector-emitter paths currents from the one and the further voltage-to-current converter flow in opposite directions, constitute the collector terminals for the connection of the load circuit.

For baising the first and the second transistor of the further voltage-to-current converter, this embodiment does not require any separate current-reference circuits. The use of sub-transistors further reduces the d.c. component of the current in the output circuit, as a result of which the voltage amplitude across the load circuit, for example, a load resistor, can approximate to the output level dictated by the supply voltage of the arrangement even more closely than in the preceding embodiments.

In the last-mentioned embodiment the arrangement has an asymmetrical output. An arrangement having a symmetrical output is obtained in that the other branch of the one voltage-to-current converter, similarly to the one branch, comprises two bipolar sub-transistors and a further voltage-to-current converter which is connected thereto and which comprises a first and a second bipolar transistor and an impedance, with a collector terminal for connection of the load circuit.

When the impedances of the one and the further voltage-to-current converter are a first and a second resistor it can be demonstrated that optimum compensation is achieved when their resistance values are in a ratio of $1:(1+2m)m/n$, where m is the number of semiconductor junctions and n is the ratio between the emitter areas of the one transistor and the further transistors of the arrangement, n being a positive number.

The transistor arrangement in accordance with the invention can readily be extended to form an arrangement with controllable gain. An embodiment thereof is characterized in that the collector terminal for the connection of the load circuit is connected to the common emitter terminal of a differential transistor pair, the collector of one of the transistors of said pair constituting an output terminal for the connection of the load circuit and the bases of said transistors constituting terminals for applying a control voltage for controlling the current to the output terminal.

A further embodiment which is based thereon is characterized in that a plurality of differential transistor pairs are connected to said collector terminal for the stepwise supply of the current to the output terminal. In this embodiment the arrangement is very suitable for control by means of a digital control signal.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
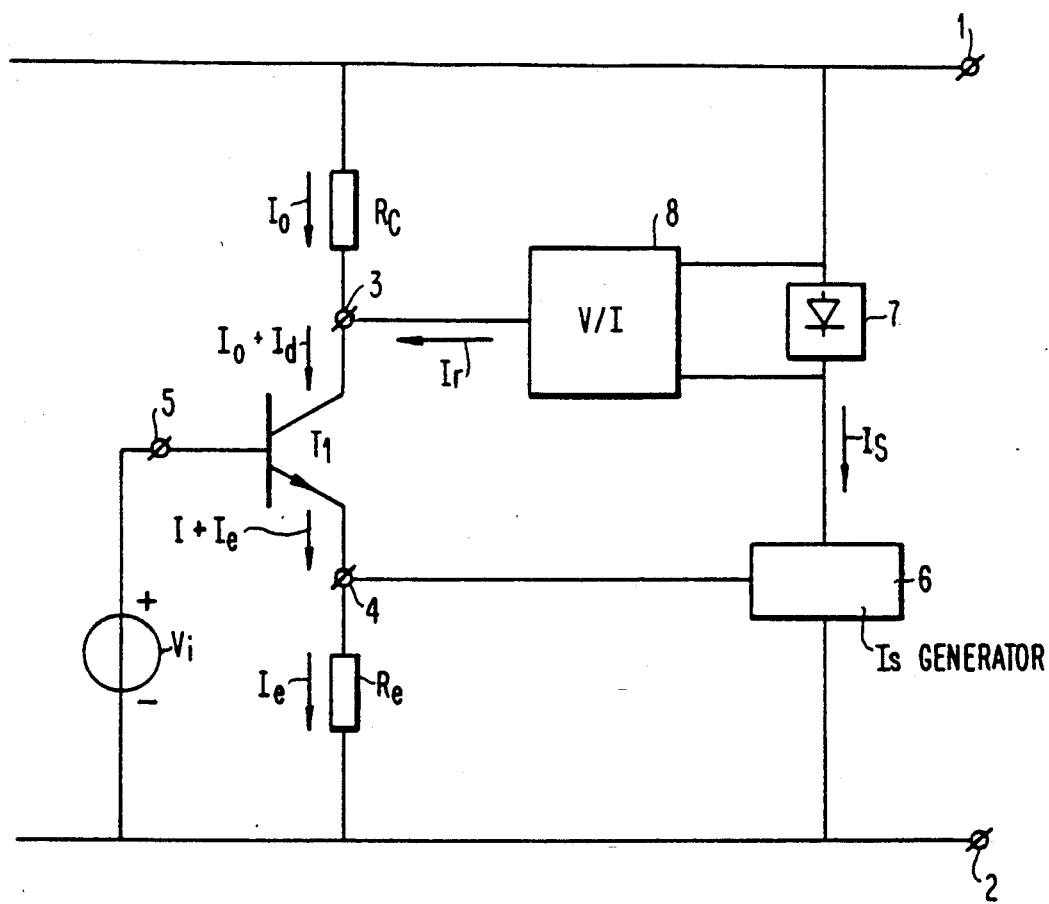
FIG. 1 shows diagrammatically a transistor arrangement with distortion compensation in accordance with the invention.

In FIG. 1 an NPN transistor T1 is shown, which in principle may form part of a more extensive transistor arrangement having power-supply terminals 1, 2. The collector of the transistor T1 constitutes a collector terminal 3 with a resistor Rc, by way of example, connected between this terminal and the power-supply terminal 1. In the present example a resistor Re is arranged between the emitter of the transistor T1, having an emitter terminal 4, and the power-supply terminal 2. The base of the transistor T1 constitutes a base terminal 5 for connection of a signal voltage source Vi, as shown. For the sake of clarity the d.c. bias means of the transistor T1 are not shown.

If the material resistance of the base-emitter junction of the transistor T1 is ignored, the following relationship is valid.

$$Vi = Vbe + (I+Ie)Re = (kT/q)\ln(I+Ie) + (I+Ie)Re$$

where k = Boltzmann's constant
T = absolute temperature
q = elementary charge
Vbe = base emitter voltage.
I = emitter direct current, and
Ie = emitter signal current The logarithmic term gives rise to a distortion component Id in the collector current, which component limits the output swing of the transistor. The influence of this distortion component depends on the signal current Ie and the d.c. setting of the transistor T1.

The invention provides a means 6, connected to the emitter terminal 4 of the transistor T1 to generate a sub-current Is which is proportional to the emitter current, i.e. the d.c. component I and the signal current component Ie of this emitter current. This sub-current Is flows through an element 7 comprising at least one semiconductor junction. The element 7 may comprise, for example, a single diode or a series arrangement of a plurality of semiconductor diodes a plurality of diode connected transistors. If, subsequently, a voltage-to-current converter 8 converts the logarithmic voltage drop across said element 7 into a correction current Ir, having a polarity as indicated by the arrow in the Figure, in such a way that this correction current is equal to the distortion component Id in the collector current, an effective compensation for the distortion component Id through the collector resistance Rc is achieved. Then only the current Io of the arrangement flows through said collector resistance Rc, which current in the present case is dictated by the instantaneous signal voltage Vi, the emitter resistance Re, the current-gain factor for the transistor T1 and the d.c. setting.

The circuit diagram of FIG. 1 clearly shows that in order to achieve the desired compensation for the distortion component no means have to be arranged in the collector-emitter path of the transistor T1. This means that the output voltage of the arrangement at, for example, the collector terminal 3 can assume the value of the supply voltage applied to the power-supply terminals 1, 2 of the transistor arrangement.

The means 6 for generating a replica of the emitter current of the transistor T1 may comprise, for example, current-mirror circuit, in a manner known per se. However, this implies that further electronic components must be arranged in the emitter line of the transistor T1, which has an adverse effect on the output swing of the transistor T1. In accordance with the invention this drawback can be avoided by arranging in the base-emitter junction of a further transistor in parallel with the base-emitter junction of the transistor T1. When this further transistor is given a smaller emitter area than the transistor T1, a replica of the emitter current of the transistor T1 is obtained, the magnitude of this emitter-current replica being dictated by the ratio between the respective emitter areas. This sub-current can subsequently be employed for generating a correction current.

Figure 2:
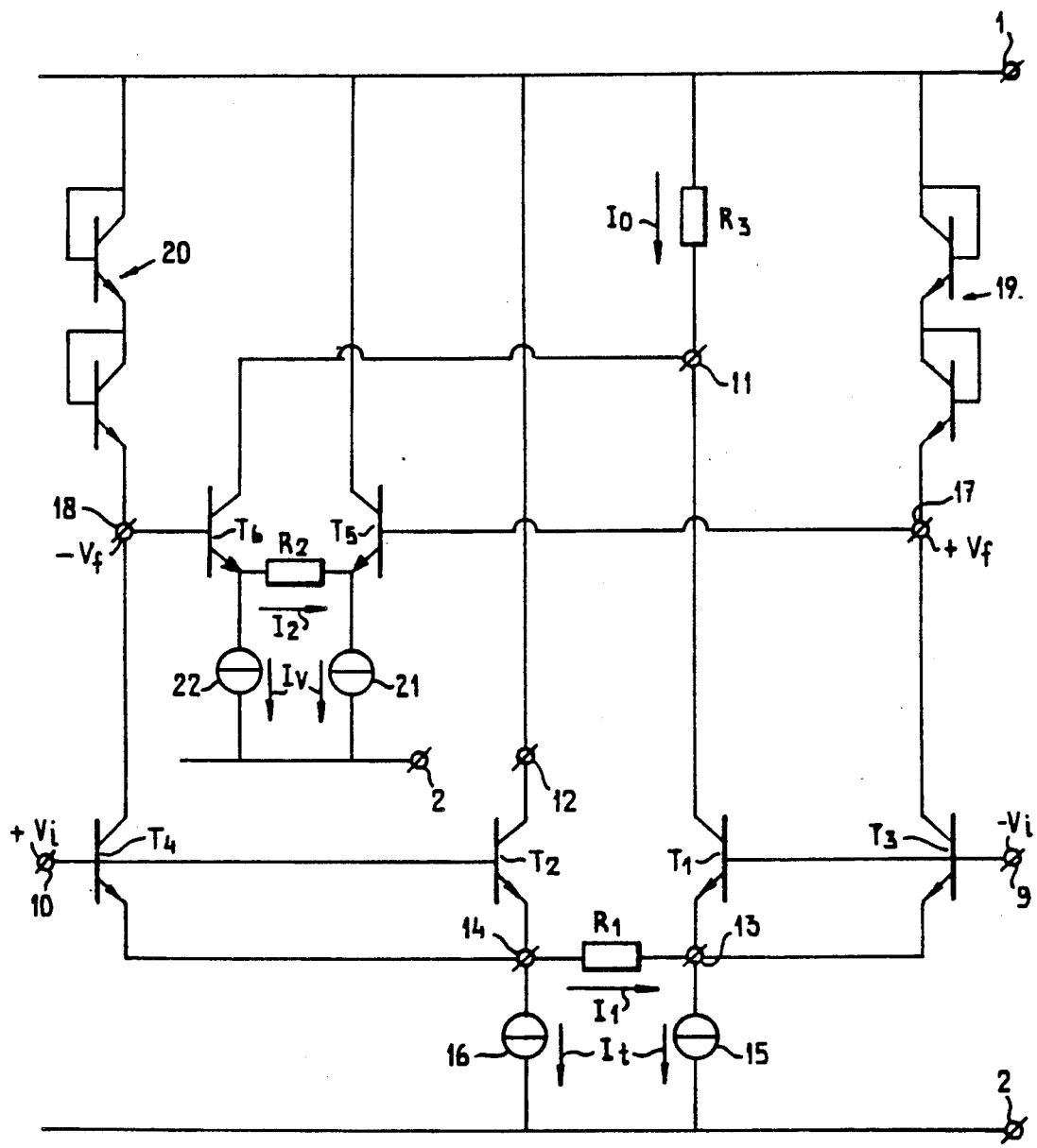
FIG. 2 shows the circuit diagram of a voltage-to-current converter with distortion compensation in accordance with the invention.

FIG. 2 shows the circuit diagram of a transistor arrangement in accordance with the invention, in which the NPN transistor T1 constitutes a first branch and the NPN transistor T2 constitutes a second branch of a voltage-to-current converter. Thus, transistors T1 and T2 are of the same conductivity type. The respective bases of the transistors T1 and T2 constitute the input terminals 9, 10 of the arrangement for receiving a signal voltage Vi, while the collectors of the two transistors T1 and T2 constitute the respective collector terminals 11, 12 for the connection of a load circuit. In the embodiment shown in FIG. 2, the collector terminal 12 is connected directly to the power supply terminal 1 of the arrangement and the collector terminal 11 is connected to this power-supply terminal via a load resistor R3. To obtain the d.c. bias of the transistors T1 and T2, their respective emitter terminals 13, 14 are each connected to the power-supply terminal 2 of the arrangement via current-reference circuits 15, 16. The term "current-reference circuit" is to be understood to mean a circuit through which a specific substantially constant direct current flows and whose impedance for a signal current is comparatively high. Such circuits are generally known per se and require no further explanation.

Morever, the emitters of the transistors T1 and T2 are interconnected via an impedance, in the present embodiment a resistor R1. A signal voltage Vi applied to the input terminals 9, 10 is converted into a proportional signal current I1 through the resistor R1, which signal current flows via the two collector-emitter paths of the transistors T1 and T2 and the load resistor R3.

As described above, the base-emitter junctions of the transistors T1 and T2 will give rise to a distortion component. If it is assumed that the two reference-signal sources 15, 16 each carries a direct current It the signal voltage Vi between the terminals 10 and 9 may be expressed as follows in terms of signal current I1:

$$Vi = Vbe2 + I1 \, R1 - Vbe1$$

where
Vbe1 = the base-emitter voltage of the transistor T1 and
Vbe2 = the base-emitter voltage of the transistor T2.
Using the logarithmic relationship between the base-emitter voltage and the base-emitter current, it follows that:

$$Vi = (kT/q)\ln\{(It+I1)/(It-I1)\} + R1 \, I1 \qquad (1)$$

The logarithmic term dictates the distortion component Id in the current through the load resistor R3.

In order to obtain a replica of the respective emitter currents of the transistors T1 and T2, in accordance with the invention, the NPN transistors T3 and T4, of the same conductivity type as the transistors T1 and T2, are provided in the arrangement. The transistor T3 has its base-emitter junction connected in parallel with the base-emitter junction of the transistor T1 and the transistor T4 has its base-emitter junction connected in parallel with the base-emitter junction of the transistor T2. The collector terminals 17, 18 of the transistor T3 and T4, respectively, are each connected to the power-supply terminal 1 via series arrangements 19, 20 each comprising two elements with a semiconductor junction. In the Figure, the series arrangements 19, 20 comprise diode-connected transistors, but it is obvious that these may be replaced by conventional diodes. Although the Figure shows two elements in each series arrangement, these series arrangements may generally comprise m elements, where m is an integer larger than 1.

If the emitter areas of the transistors are in the following ratio:

$$T1:T2:T3:T4 = 2n:2n:1:1$$

where n=a positive integer, a sub-current equal to $(It-I1)/(2n+1)$ will flow through the series arrangement 19 and sub-current equal to $(It+I1)/(2n+1)$ will flow through the series arrangement 20.

This results in a logarithmic voltage Vf between the collector terminals 17, 18 of the transistors T3 and T4 respectively, which voltage is equal to:

$$Vf = m(kT/q)\ln[\{(It + I1)/(2n + 1)\}/\{(It - I1)/(2n + 1)\}] \\ = m(kT/q)\ln\{(It + I1)/(It - I1)\} \quad (2)$$

which relates to the general case in which the series arrangements 19, 20 each comprises m elements with a semiconductor junction.

When the factor m is ignored, the voltage Vf depends on the emitter currents of the transistors T1 and T2 in the same way as the respective base-emitter voltages.

In accordance with the invention, a further voltage to current converter is provided to convert the voltage Vf into a correction current for the distortion component of the current through the load resistor R3, which converter comprises the NPN transistors T5 and T6 (of the same conductivity type as the transistors T1 and T2), a resistor R2 and current-reference circuits 21, 22. The bases of the transistors T5 and T6 are connected to the collector terminals 17, 18 respectively, the collector of the transistor T5 being connected to the power-supply terminal 1 and the collector of the transistor T6 being connected to the collector terminal 11 of the transistor T1. In the same way as in the voltage-to-current converter comprising the transistors T1 and T2, the emitters of the transistors T5 and T6 are interconnected via a resistor R2 and their d.c. settings are provided by current reference circuits 21, 22.

The d.c. bias current Iv of the current-reference circuits 21, 22 can be substantially smaller than the bias current It of the current-reference circuits 15, 16 because the transistors T5 and T6 need supplying only a current of the same magnitude as the distortion component. This means that the collector currents of the transistors T5 and T6 themselves will exhibit a negligible distortion component.

Using the relationship (2), it follows that the current in the collector of the transistor T6 is then equal to $$Iv + I2 = Iv - Vf/R2 = Iv - m\,kT/(qR2) \\ \ln\{(It+I1)/(It-I1)\} \quad (3)$$

Subsequently, using equations (1) and (3) it follows that the current Io through the load resistor R3 is:

$$Io = It - I1 + Iv + I2 \\ Io = It - Vi/R1 + kT/(qR1)\ln\{(It + I1)/(It - I1)\} + \\ Iv - mkT/(qR2)\ln\{(It + I1)/(It - I1)\}$$

The logarithmic distortion component can now be compensated for effectively if:

$$m/R2 = 1/R1 \text{ or } R2 = m\,R1$$

This simple relationship follows from the fact that the circuit for generating the correction component employs a voltage-to-current converter of a construction similar to that used in the transistor arrangement itself.

Figure 3:
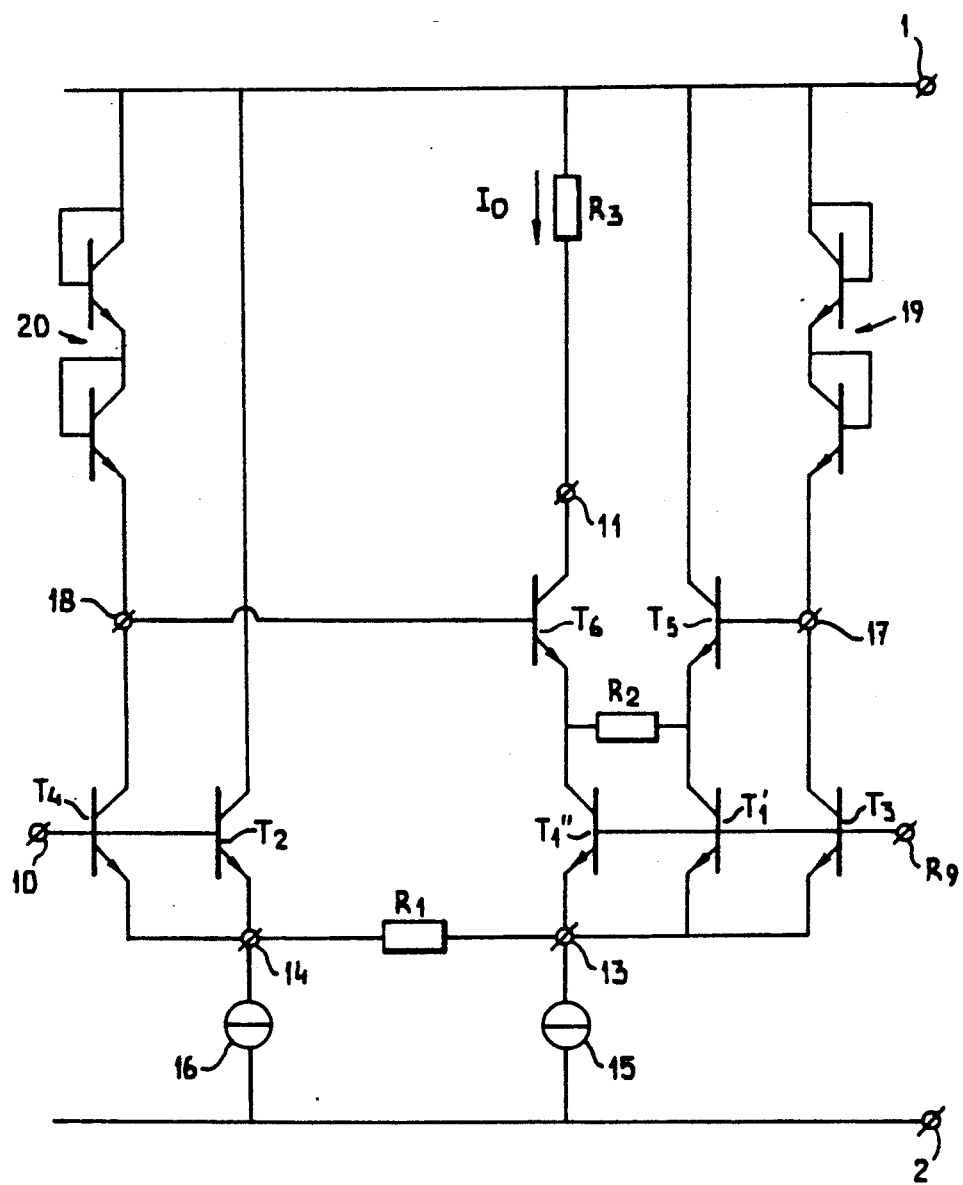
FIG. 3 shows a modification of the arrangement shown in FIG. 2.

FIG. 3 shows a voltage-to-current converter similar to the arrangement shown in FIG. 2 but in which the transistor T1 is split up into two sub-transistors T1' and T1". The base-emitter junctions of these sub-transistors T1' and T1" are arranged in parallel, the emitters of the transistors T5 and T6 being connected to the respective collectors of said sub-transistors. The load resistor R3 is arranged in the collector line of the transistor T6 and the collector of the transistor T5 is connected directly to the power-supply terminal 1. The two sub-transistors T1' and T1" provide the d.c. settings of the transistors T5 and T6 so that in contrast to the arrangement shown in FIG. 2 separate current-reference circuits 21, 22 are not needed.

In a similar way as for the arrangement shown in FIG. 2, it can be demonstrated that if the emitter areas of the transistors are in the following ratio:

$$T1':T1'':T2:T3:T4 = n:n:2n:1:1$$

the distortion component in the current Io is compensated for effectively if:

$$R1:R2 = 1:(2n+1)m/n$$

In addition to the advantage that separate current-reference circuits 12, 22 may be dispensed with, splitting the transistor T1 into two sub-transistors T1', T1", has the advantage that the d.c. component through the load resistor R3 in the given example is approximately half the direct current through the load resistor R3 in the arrangement shown in FIG. 2. As a result of this, the output swing of the arrangement will be situated even closer to the maximum output swing as dictated by the power-supply voltage.

If an arrangement having a symmetrical output is required, the transistor T2, in the same way as the transistor T1, can be divided into two sub-transistors to which a voltage-to-current converter comprising the transistors T5 and T6 and a resistor R2 (not shown) is connected.

Figure 4:
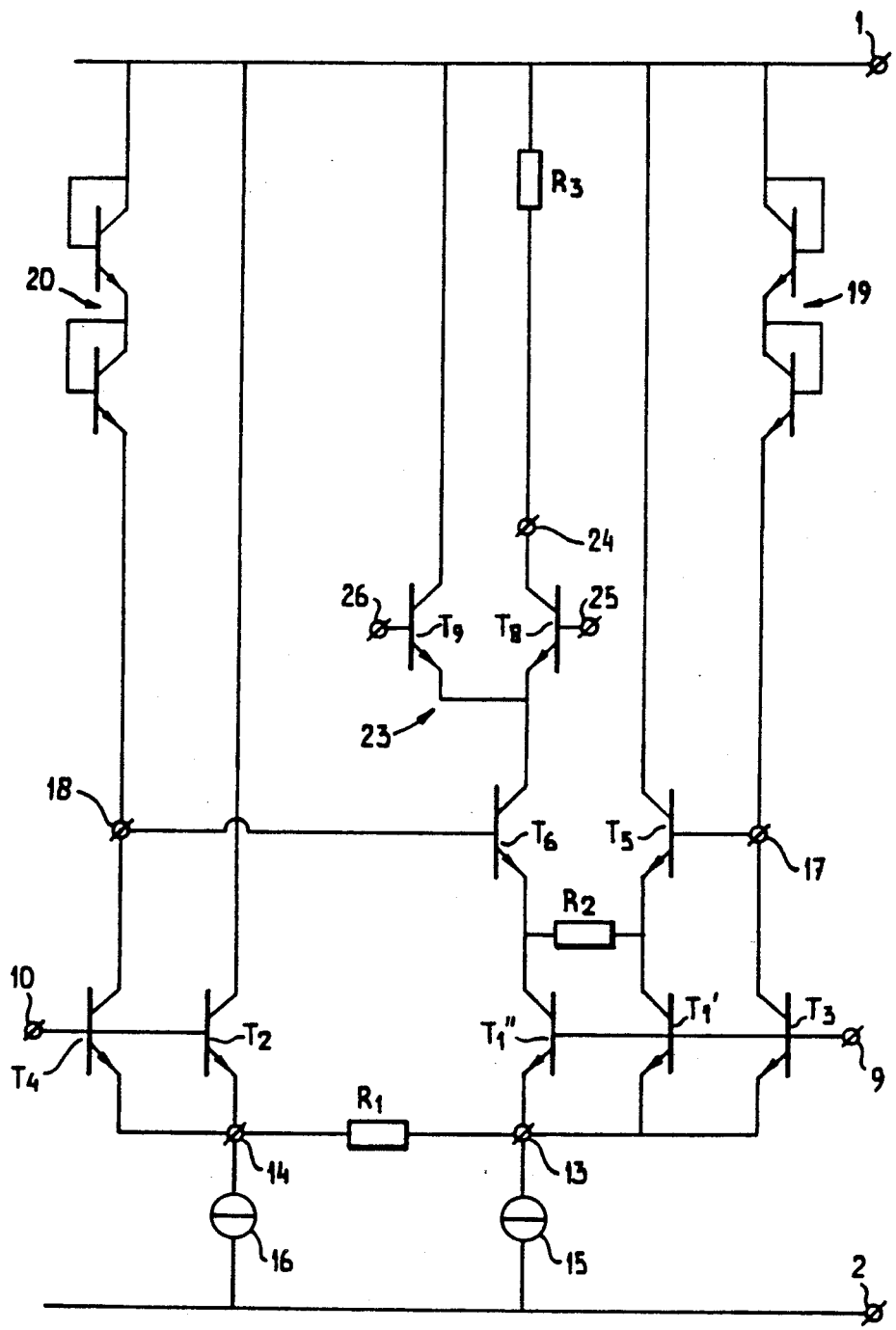
FIG. 4 shows an arrangement as shown in FIG. 3, comprising a gain-control circuit.

FIG. 4 shows the circuit diagram of a voltage-to-current converter based on the arrangement shown in FIG. 3 and comprising a control circuit for controlling the current through the load resistor R3. This control circuit comprises the NPN transistors T8 and T9, which are arranged as a differential pair 23 and to whose common emitter terminal the collector of the transistor T6 is connected. The collector of the biopolar control transistor T9 is connected directly to the power-supply terminal 1, and the collector of the biopolar control transistor T8 constitutes an output terminal 24 for connecting a load circuit, in the present case of the resistor R3. The current through the resistor R3 can be influenced by applying a control voltage to the bases of the transistors T8 and T9 via control terminals 25 and 26, respectively.

Figure 5:
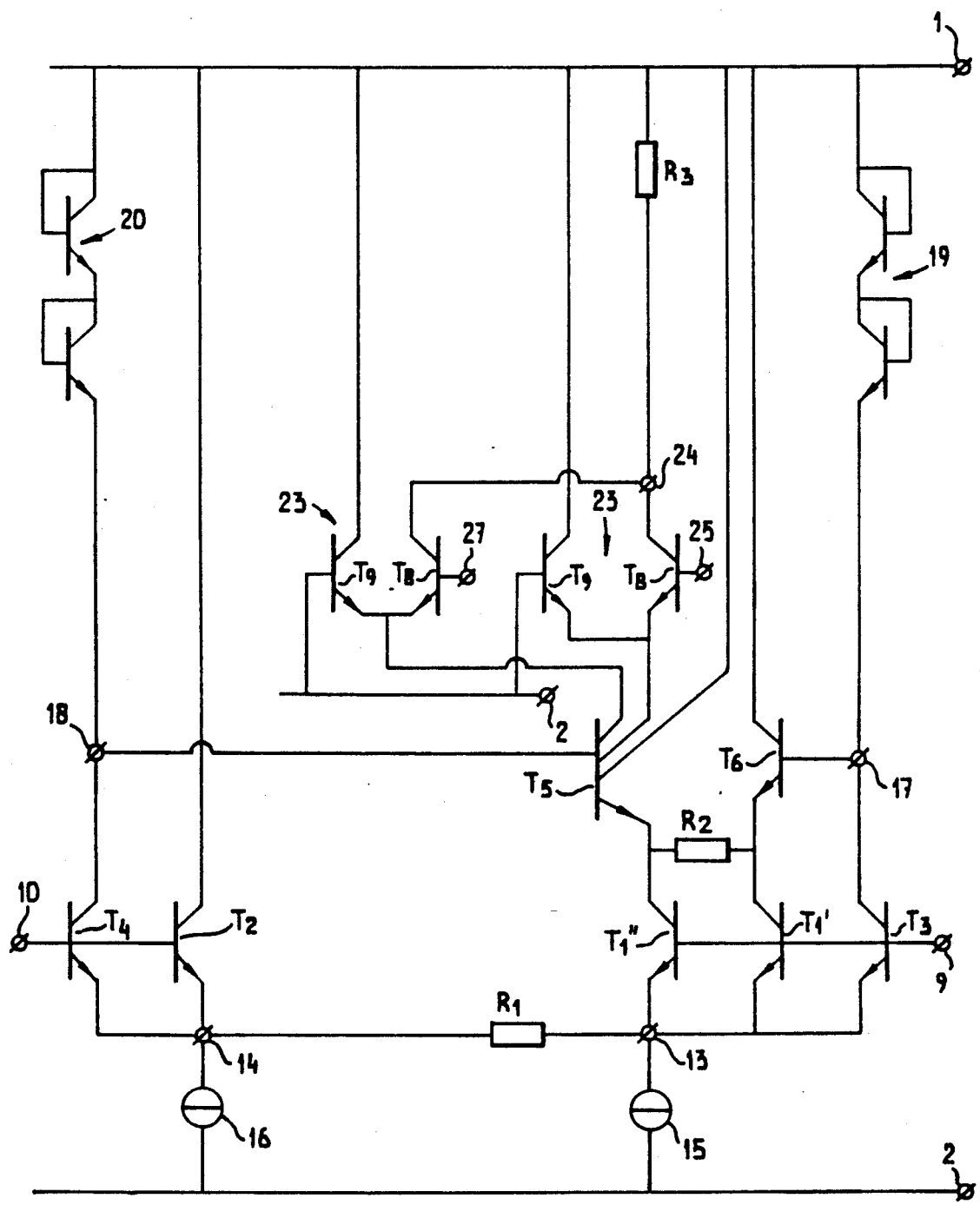
FIG. 5 shows a further embodiment of the arrangement shown in FIG. 4 constructed to provide digital gain control.

FIG. 5 shows a further embodiment based on the principle illustrated in FIG. 4, in which a plurality of differential transistor pairs 23 are connected to the collector of the transistor T5, which for this purpose comprises a multi-collector terminal. As is shown the base of one transistor T9 of the differential pairs is connected to the power-supply terminal 2 and the base of the other transistor T8 is provided with a terminal 25, 27 for applying a control voltage. The current through the load resistor R3 can be controlled in steps, for examle by means of a digital signal. Although only two differential pairs 23 are shown, it is obvious that the arrangement may be extended to comprise further differential pairs.

In the embodiment of the invention shown herein all of the transistors are NPN transistors. Of course, it is possible to replace these by PNP transistors, in which case, for example, for the voltate-to-current converter in the correction circuit and for the transistors T5 and T6 field-effect transistors may be used instead of the bipolar transistors, or voltage-to-current converters of a different construction may be used instead of the resistors R1, R2, R3, it is also possible to utilize, for example, frequency-dependent impedances or further semiconductor components. Instead of a symmetrical, input the voltage-to-current converter comprising the transistors T1 and T2 may have an asymmetrical input, which can be achieved for example by connecting the base terminal 9 to the power-supply terminal 2.

The invention is very suitable for use in integrated circuits, for example, to form an analog multiplexer with very good distortion characteristics, for which purpose the resistor R3 may be provided with a plurality of compensation circuits which can be selected by means of differential current switches.

We claim:

1. A bipolar transistor arrangement with distortion compensation comprising; at least one bipolar transistor having a base, emitter and a collector for passing a transistor collector current, in which, in operation, a part of the transistor collector current depends upon the transistor base-emitter voltage, the collector of said transistor constituting a transistor collector terminal for connection of a load circuit and the base of said transistor constituting a base terminal for connection of a signal voltage source, means coupled to said transistor for supplying to an element a sub-current which is substantially linearly proportional to a current in the emitter of the transistor, said element having at least one semiconductor junction for producing a voltage which depends on said sub-current, and conversion means coupled to said element for supplying to the transistor collector terminal a current which is substantially linearly proportional to said voltage in order to compensate for that part of the transistor collector current which depends upon the transistor base-emitter voltage.

2. A bipolar transistor arranement as claimed in claim 1, wherein the means for supplying the sub-current comprises a first further bipolar transistor of the same conductivity type as the one bipolar transistor and having a smaller emitter area than than of said one bipolar transistor, means for connecting base-emitter junctions of said one bipolar transistor and said first further bipolar transistor in parallel thereby forming a common base and a common emitter terminal, means connecting a collector terminal of said first further bipolar transistor to said element and to the conversion means.

3. A a bipolar transistor arrangement as claimed in claim 2, wherein said one bipolar transistor constitutes a first branch of a voltage to current converter having a second branch including a second bipolar transistor of the same conductivity type as said one bipolar transistor, means connecting to said second bipolar transistor a circuit which comprises a second further bipolar transistor having a collector terminal, a second element having at least one semiconductor junction and a d.c. bias means, means for connecting base-emitter junctions of said second bipolar transistor and said second further bipolar transistor in parallel to form a second common base terminal and a second common emitter terminal, the second further bipolar transistor having a smaller emitter area than said second bipolar transistor and the d.c. bias means comprising a current-reference circuit having first and second branches connected in series with the first and second common emitter terminals, respectively, which common emitter terminals are interconnected by a first impedance, and the conversion means comprises a further voltage-to-current converter comprising first and second voltage input terminal connected to respective collector terminals of the first and second further bipolar transistors, and at least one current output terminal coupled to a collector terminal of at least one bipolar transistor of the voltage-to-current converter.

4. A bipolar transistor arrangement as claimed in claim 3, wherein the further voltage-to-current converter comprises a third and fourth bipolar transistor of the same conductivity type as said one bipolar transistor, respective bases of said third and fourth transistors comprising said first and second voltage input terminals of the further voltage-to-current converter, a second current-reference circuit having first and second branches connected in series with respective emitters of the third and fourth bipolar transistors, which emitters are interconnected via a second impedance, and at least one of the third and fourth bipolar transistors having its collector connected to the collector terminal of one bipolar transistor of the voltage-to-current converter.

5. A bipolar transistor arrangement as claimed in claim 4, wherein the element having at least one semiconductor junction comprises a series arrangement of m diodes or m diode-connected transistors, m being an integer greater than 1, emitter areas of said one and second bipolar transistors being substantially equal and emitter areas of the first and second further transistors being substantially equal, and wherein the first and second impedances comprise a first and second resistor, respectively, whose resistance values are in a ratio of 1:m.

6. A bipolar transistor arrangement as claimed in claim 3, wherein said one bipolar transistor in the voltage-to-current converter comprises two bipolar sub-transistors of the same conductivity type, a sum of the emitter areas of the two sub-transistors being equal to the emitter area of the one bipolar transistor, which sub-transistors have their base-emitter junctions connected in parallel with one another, the further voltage-to-current converter comprising a third and a fourth bipolar transistor of the same conductivity type as said one bipolar transistor, said third and said fourth transistor havng their respective bases connected via said first and second voltage input terminals, respectively, to the respective collector terminals of the first and second further bipolar transistors, which first and second further bipolar transistors are coupled respectively to the first and the second branch of the voltage-to-current converter, and wherein respective emitters of the third and fourth bipolar transistor are connected to respective collectors of the two sub-transistors, which emitters are interconnected via a second impedance, and a collector of the third or the fourth bipolar transistor comprises the collector terminal for connection of the load circuit, and wherein currents flow in opposite directions in collector-emitter paths of the voltage-to-current converter and the further voltage-to-current converter.

7. A bipolar transistor arrangement as claimed in claim 6, wherein the element having at least one semiconductor junction comprises a series arrangement of m diodes or m diode-connected transistors, m being an integer greater than 1, emitter areas of the one bipolar transistor and the further bipolar transistor being in a ratio of 2 n: 1, n being a positive number, and the first and second impedances comprise a first and a second resistor, respectively, whose resistance values are in a ratio of 1: (1+2 n)m/n.

8. A bipolar transistor arrangement as claimed in claim 3, wherein the collector terminal for connection of the load circuit is connected to a common emitter terminal of first and second transistors of a differential transistor pair, a collector of one of the transistors of said differential transistor pair constituting an output terminal for connection of the load circuit and bases of the first and second transistors of said differential transistor pair constituting terminals for applying a control voltage for controlling a current to the output terminal.

9. A bipolar transistor arrangement as claimed in claim 2, wherein the collector terminal for connection of the load circuit is connected to a common emitter terminal of first and second transistors of a differential transistor pair, a collector of one of the transistors of said differential transistor pair constituting an output terminal for connection of the load circuit and bases of the first and second transistors of said differential transistor pair constituting terminals for applying a control voltage for controlling a current to the output terminal.

10. A bipolar transistor arrangement as claimed in claim 1, wherein the collector terminal for connection of the load circuit is connected to a common emitter terminal of first and second transistors of a differential transistor pair, a collector of one of the transistors of said differential transistor pair constituting an output terminal for connection of the load circuit and bases of said first and second transistors of the differential transistor pair constituting terminals for applying a control voltage for controlling a current to the output terminal.

11. A bipolar transistor arrangement as claimed in claim 10, wherein a plurality of differential transistor pairs are connected to said collector terminal thereby to control the current to the output terminal in current steps.

12. A bipolar transistor arrangement as claimed in claim 11, wherein the bipolar transistor which includes the collector terminal for connection of the load circuit comprises a multi-collector transistor.

13. A bipolar transistor circuit with compensation for a distortion component (Id) of a transistor collector current which is determined by a base-emitter voltage of the transistor, said circuit comprising:
an input terminal for receiving a signal voltage,
an output terminal for connection to a load circuit,
at least one bipolar transistor having a first main electrode coupled to said output terminal, a control electrode coupled to said input terminal, and a second main electrode,
an element comprising at least one semiconductor junction for developing a non-linear voltage across said element as a function of a current flowing therein,
means coupled to said one bipolar transistor second main electrode for supplying a sub-current to said element which is proportional to a current flowing through said second main electrode, whereby said non-linear voltage is determined by said sub-current, and
voltage/current conversion means coupled to said element and to said first main electrode of the one bipolar transistor to supply a correction current (Ir) to the first main electrode and which is proportional to the voltage developed across the element thereby to compensate said distortion component (Id).

14. A bipolar transistor circuit as claimed in claim 13, wherein:
said first and second main electrodes comprise a collector and an emitter, respectively, and the control electrode is a base, of said one bipolar transistor,
the means for supplying the sub-current comprise a further bipolar transistor of the same conductivity type as said one bipolar transistor and having a smaller emitter area than that of said one bipolar transistor, means connecting base-emitter junctions of said one bipolar transistor and said further bipolar transistor in parallel thereby forming a common base terminal and a common emitter terminal, and
means coupling a collector of said further bipolar transistor to said element and to said voltage/current conversion means.

15. A bipolar transistor circuit as claimed in claim 14, wherein said voltage/current conversion means comprises first bipolar transistor means of the same conductivity type as said one bipolar transistor and said further bipolar transistor and having a base electrode coupled to said element and a collector electrode coupled to said output terminal.

16. A bipolar transistor circuit as claimed in claim 14, wherein said one bipolar transistor comprises first and second bipolar sub-transistors of the same conductivity type and with their base-emitter junctions connected in parallel with one another and in parallel with the base-emitter junction of said further bipolar transistor.

17. A bipolar transistor circuit as claimed in claim 16, wherein said voltage/current conversion means comprise first and second bipolar transistors of the same conductivity type as the further bipolar transistor and connected in first and second series circuits which include the first and second bipolar sub-transistors, respectively.

18. A bipolar transistor circuit as claimed in claim 17, further comprising a bipolar control transistor of the same conductivity type as the further bipolar transistor and connected in said first series circuit, said first series circuit being connected to said output terminal, and
means coupling a control electrode of the bipolar control transistor to a control terminal for a signal for controlling a current in said first series circuit.

* * * * *